United States Patent [19]

Rhiger

[11] Patent Number: 5,391,882
[45] Date of Patent: Feb. 21, 1995

[54] SEMICONDUCTOR GAMMA RAY DETECTOR INCLUDING COMPOSITIONALLY GRADED, LEAKAGE CURRENT BLOCKING POTENTIAL BARRIER LAYERS AND METHOD OF FABRICATING THE DETECTOR

[75] Inventor: David R. Rhiger, Santa Barbara, Calif.

[73] Assignee: Santa Barbara Research Center, Goleta, Calif.

[21] Appl. No.: 75,975

[22] Filed: Jun. 11, 1993

[51] Int. Cl.⁶ ............... H01L 31/105; H01L 31/0304; H01L 31/0296
[52] U.S. Cl. .................... 250/370.13; 250/370.12; 250/370.14; 267/188; 267/189; 267/191
[58] Field of Search .................. 250/370.13, 370.12, 250/370.14; 257/191, 189, 188

[56] References Cited

U.S. PATENT DOCUMENTS 4,801,984  1/1989  Woodall ........................... 257/191
5,162,891  11/1992 Burroughes et al. ............. 267/183

OTHER PUBLICATIONS

Hazlett, T. et al., "Large, High Resolution CdTe Gamma Ray Sensors", *IEEE Transactions on Nuclear Science*, vol. 33, No. 1, Feb. 1986, pp. 332–335.
Ryan, F. et al., "Gamma Ray Detectors with HgCdTe Contact Layers", *Applied Physics Letters*, vol. 46, No. 3, Feb. 1985, pp. 274–276.

*Primary Examiner*—Constantine Hannaher
*Attorney, Agent, or Firm*—W. C. Schubert; W. K. Denson-Low

[57] ABSTRACT

A P-type/intrinsic/N-type (P-I-N) gamma ray detector (10) includes a semiconductor detector layer (12) of intrinsic cadmium telluride (CdTe) or cadmium zinc telluride (CdZnTe). P- and N-doped semiconductor layers (14,16) of mercury cadmium telluride (HgCdTe) are formed on the opposite surfaces (12a,12b) of the detector layer (12), and ohmic metal contacts (18,20) are formed on the doped layers (14,16). The composition of the doped layers (14,16) is $Hg_{1-x}Cd_xTe$, and is graded such that x progressively decreases with distance from the detector layer (12) toward the ohmic contacts (18,20). This causes the bandgap of the doped layers (14,16) to also decrease from the detector layer (12) toward the ohmic contacts (18,20), forming potential barriers (E1,E2) which block leakage currents constituted by injection of minority carriers from the ohmic contacts (18,20) into the detector layer (12) and provide low resistance between the doped layers (14,16) and ohmic contacts (18,20). The detector layer (12) and doped layers (14,16) are annealed during fabrication, causing diffusion of mercury from the doped layers (14,16) into the detector layer (12) and diffusion of cadmium from the detector layer (12) into the doped layers (14,16), thereby increasing the heights of the potential barriers (E1,E2).

22 Claims, 4 Drawing Sheets

SEMICONDUCTOR GAMMA RAY DETECTOR INCLUDING COMPOSITIONALLY GRADED, LEAKAGE CURRENT BLOCKING POTENTIAL BARRIER LAYERS AND METHOD OF FABRICATING THE DETECTOR

BACKGROUND OF THE INVENTION

1. Field of the Invention

The present invention generally relates to the detection of gamma rays, and more specifically to a semiconductor P-type/Intrinsic/N-type (P-I-N) gamma ray detector and fabrication method which provide potential barriers for blocking leakage current and low resistance ohmic contacts.

2. Description of the Related Art

Gamma ray detectors are used in numerous fields including nuclear instrumentation, medical imaging, biological research and dosimetry. An especially useful application of a semiconductor gamma ray detector is as a sensing element in a gamma-ray spectrometer.

Cadmium telluride (CdTe) is an effective solid-state compound semiconductor material for detecting gamma rays, since it has a relatively high atomic number of 50 which provides a large cross section for ray interaction. It also has a large bandgap of 1.5 eV which enables operation at room temperature. The addition of zinc (Zn) to cadmium telluride produces cadmium zinc telluride (CdZnTe) which has a higher bandgap of approximately 1.6 eV.

A basic P-I-N semiconductor gamma ray detector includes a wafer of intrinsic cadmium telluride or cadmium zinc telluride with doped contacts formed on the opposite surfaces thereof. A reverse biasing electric field is applied across the contacts. Gamma rays passing through the wafer liberate electron-hole pairs which are swept to the respective contacts by the electric field and generate electrical pulses in an associated electronic unit.

A detector of this type is described in an article entitled "LARGE, HIGH RESOLUTION CdTe GAMMA RAY SENSORS", by T. Hazlett et al, in IEEE Transactions on Nuclear Science, Vol. 33, No. 1, Feb. 1986, pp. 332-335. A P-type contact is formed on a surface of a cadmium telluride wafer by diffusion of gold (Au), and an N-type contact is formed on the opposite surface of the wafer by diffusion of indium (In).

A disadvantage of this structure is that the wide bandgap which makes cadmium telluride effective as a gamma ray detecting material also makes it difficult to form direct metal contacts in a controllable manner thereon due to interface states between the wafer and the metal contacts.

The basic detector is also subject to substantial leakage currents caused by injection of minority carriers from the contacts into the wafer. These leakage currents create undesirable effects including electrical noise and a reduction of the voltage which can be applied across the detector, thereby degrading the charge collection efficiency and energy resolution in the gamma ray energy spectrum. This is especially detrimental when the detector is used as a sensing element for gamma ray spectrometry.

An improved P-I-N gamma ray detector is described in an article entitled "GAMMA RAY DETECTORS WITH HgCdTe CONTACT LAYERS", by F. Ryan et al, in Applied Physics Letters, Vol. 46, No. 3, Feb. 1985, pp. 274-276. P- and N- doped layers of mercury cadmium telluride (HgCdTe) of composition ($Hg_{1-x}Cd_xTe$) are formed on the opposite surfaces of a cadmium telluride wafer. The values of x for the P- and N-doped layers are 0.6 and 0.31 respectively. Ohmic contact layers of gold and indium are formed on the P- and N-doped layers respectively.

The mercury cadmium telluride layers separate the metal contacts from the cadmium telluride wafer, thereby eliminating the metal/CdTe interface states and associated fabrication problems. The mercury cadmium telluride layers may also produce potential barriers on the order of 0.6–0.7 eV which would suppress the flow of leakage currents from the ohmic contacts into the wafer, although the possibility of such barriers is not acknowledged in Ryan's article.

SUMMARY OF THE INVENTION

In a method of fabricating a P-type/intrinsic/N-type (P-I-N) gamma ray detector embodying the present invention, P- and N-doped semiconductor layers of mercury cadmium telluride (HgCdTe) are formed on the opposite surfaces of a semiconductor detector layer of intrinsic cadmium telluride (CdTe) or cadmium zinc telluride (CdZnTe). Ohmic metal contacts are formed on the doped layers.

The composition of the doped layers is $Hg_{1-x}Cd_xTe$, and is graded such that x progressively decreases with distance from the detector layer toward the ohmic contacts. This causes the bandgap of the doped layers to also decrease from the detector layer toward the ohmic contacts, forming potential barriers which block leakage currents constituted by injection of minority carriers from the ohmic contacts into the detector layer.

The detector layer and doped layers are annealed during fabrication, causing diffusion of mercury from the doped layers into the detector layer and diffusion of cadmium from the detector layer into the doped layers, thereby increasing the heights of the potential barriers.

The compositional grading and interdiffusion of mercury and cadmium at the surfaces of the detector layer substantially increase the heights of the potential barriers. Carrier density is exponentially related to energy. Increasing the potential barrier height from the prior art maximum of 0.7 eV to a level of 1.0 eV which is attainable with the present invention reduces the leakage current by a factor of $10^5$ at 300° K.

Reduction of leakage currents reduces electrical noise in the detector, and enables a larger voltage to be applied across the detector, thereby improving the charge collection efficiency and sharpening the energy resolution in the gamma ray energy spectrum for gamma ray spectrometry. Another advantage of higher applied voltage is faster charge collection, thereby improving the time resolution of the detector.

In addition to providing potential barriers to leakage current, the doped layers have a narrow bandgap (relative to the detector layer) at their outer surfaces, making it easy to form ohmic metal contacts thereon.

Although the present detector is especially suitable for the detection of gamma rays, it can also be applied to the detection of other high energy rays such as X-rays.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
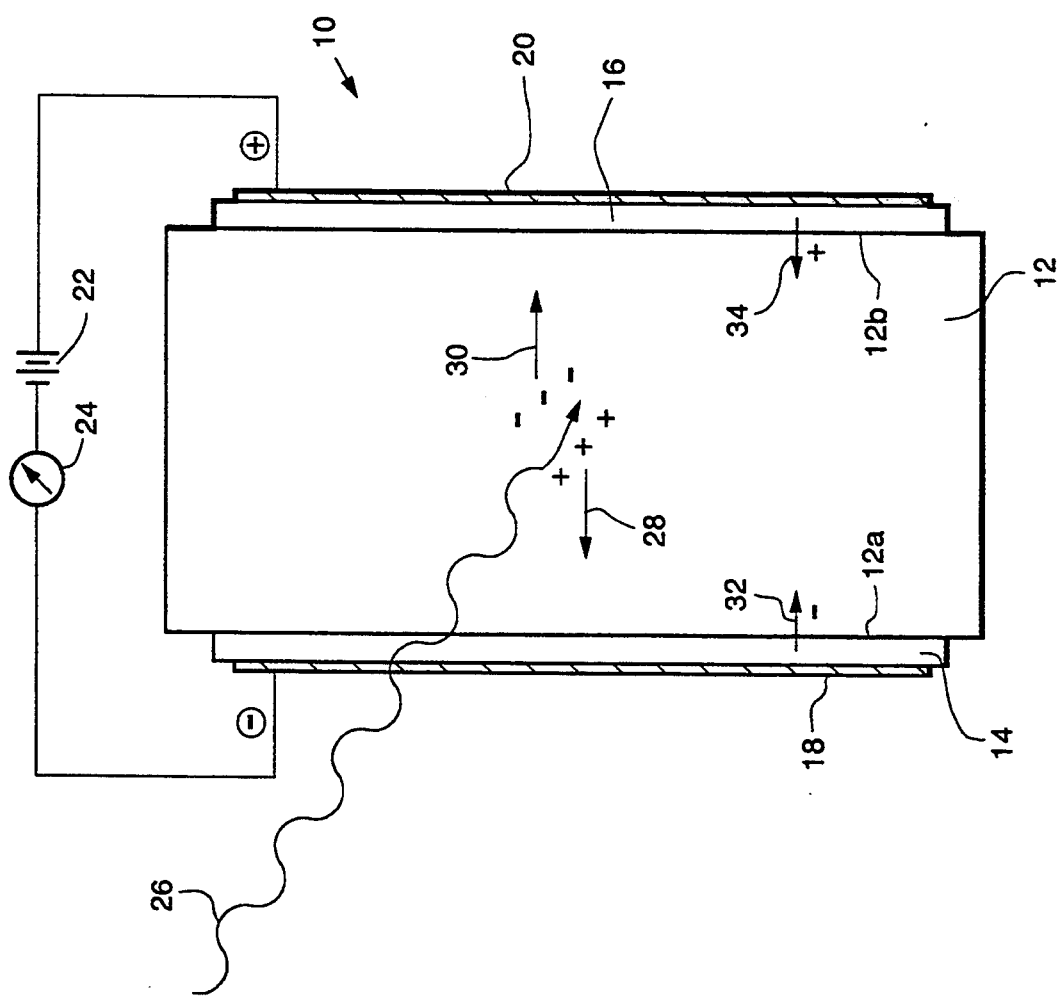
FIG. 1 is a simplified sectional view illustrating a semiconductor gamma ray detector embodying the present invention.

A semiconductor gamma ray detector 10 embodying the present invention is illustrated in FIG. 1, and includes a detector layer 12 in the form of a wafer of wide bandgap compound semiconductor material. The preferred material for the detector layer 12 is cadmium telluride (CdTe) or cadmium zinc telluride (CdZnTe), which have bandgaps of 1.5 and 1.6 eV at 300° K. respectively and an average atomic number of 50.

The detector layer 12 is monocrystalline and substantially intrinsic. The thickness of the layer 12 is 100-10,000 micrometers, with the preferred value being 1,000 micrometers.

A heavily P-doped semiconductor contact layer 14 is formed on a first surface 12a of the detector layer 12. The preferred material for the layer 14 is mercury cadmium telluride (HgCdTe). The thickness of the layer 14 is 1-50 micrometers, with the preferred value being 20 micrometers. The layer 14 is doped with arsenic (As) or other P-type dopant to a concentration of $10^{16}$–$10^{18}$ ions/cm$^3$, with the preferred value being $10^{18}$ ions/cm$^3$.

A heavily N-doped semiconductor contact layer 16 is formed on a second surface 12b of the detector layer 12, and typically has the same thickness and doping level as the layer 14. A suitable N-type dopant for the layer 16 is indium (In). Where cadmium zinc telluride is selected as the material for the detector layer 12, the composition is preferably $Cd_{0.96}Zn_{0.04}Te$ to match the lattice constants of the layers 12, 14 and 16.

A gold (Au) or other ohmic metal contact 18 is formed on the P-doped layer 14, whereas a palladium (Pd) or other ohmic metal contact 20 is formed on the N-doped layer 16. The detector 10 has a P-type/Intrinsic/N-type configuration, constituted by the layers 14, 12 and 16 respectively. The detector 10 is reverse biased by a D.C. voltage source 22 via the contacts 18 and 20 such that the P-doped layer 14 is maintained negative relative to the N-doped layer 16.

An electronic instrument 24 is connected in series with the detector 10 and source 22 to detect changes in current flow through the detector 10. The instrument 24 may be a gamma ray spectrometer or any other device for processing signals generated by the detector 10. Although not shown, a thin metal or other suitable filter may be provided in front of the energy receiving surface of the detector 10 for preventing lower energy rays and electromagnetic radiation, including visible light, from reaching the detector 10.

In operation, gamma rays pass through the detector 10 as indicated at 26. Each photon of gamma ray energy liberates a number of electron-hole pairs in the detector layer 12. Liberated holes are swept through the P-doped layer 14 and instrument 24 to the negative terminal of the source 22 as indicated by an arrow 28, whereas liberated electrons are swept through the N-doped layer 16 to the positive terminal of the source 22 as indicated by an arrow 30. The total current through the instrument 24 varies in accordance with the detected gamma rays, and is processed and/or displayed by the instrument 24 as desired.

The bias voltage applied to the detector 10 urges leakage currents to flow from the contacts 18 and 20 into the detector layer 12. More specifically, minority electrons are urged to flow from the contact 18 through the P-doped layer 14 into the detector layer 12 as indicated by an arrow 32, and minority holes are urged to flow from the contact 20 through the N-doped layer 16 into the detector layer 12 as indicated by an arrow 34.

These leakage currents create undesirable effects including electrical noise and a reduction of the voltage which can be applied across the detector, thereby degrading the charge collection efficiency and energy resolution in the gamma ray energy spectrum.

The leakage currents are effectively suppressed in accordance with the present invention by selection of the doping concentration, compositional grading and interdiffusion of elements in the layers 14 and 16. More specifically, the composition of the layers 14 and 16 is graded such that the bandgap decreases away from the surfaces 12a and 12b of the detector layer 12 respectively.

The composition of the layers 14 and 16 is $Hg_{1-x}Cd_xTe$. The grading is selected such that x varies continuously from approximately $0.6 \leq X \leq 1.0$ at the first and second surfaces 12a and 12b of the detector layer 12 to approximately $0 \leq X \leq 0.4$ at the interfaces of the layers 14 and 16 and the ohmic contacts 18 and 20 respectively. The preferred values are $x=0.8$ at the surfaces 12a and 12b and $x=0.2$ at the interfaces of the layers 14 and 16 and the contacts 18 and 20 respectively.

Figure 2:
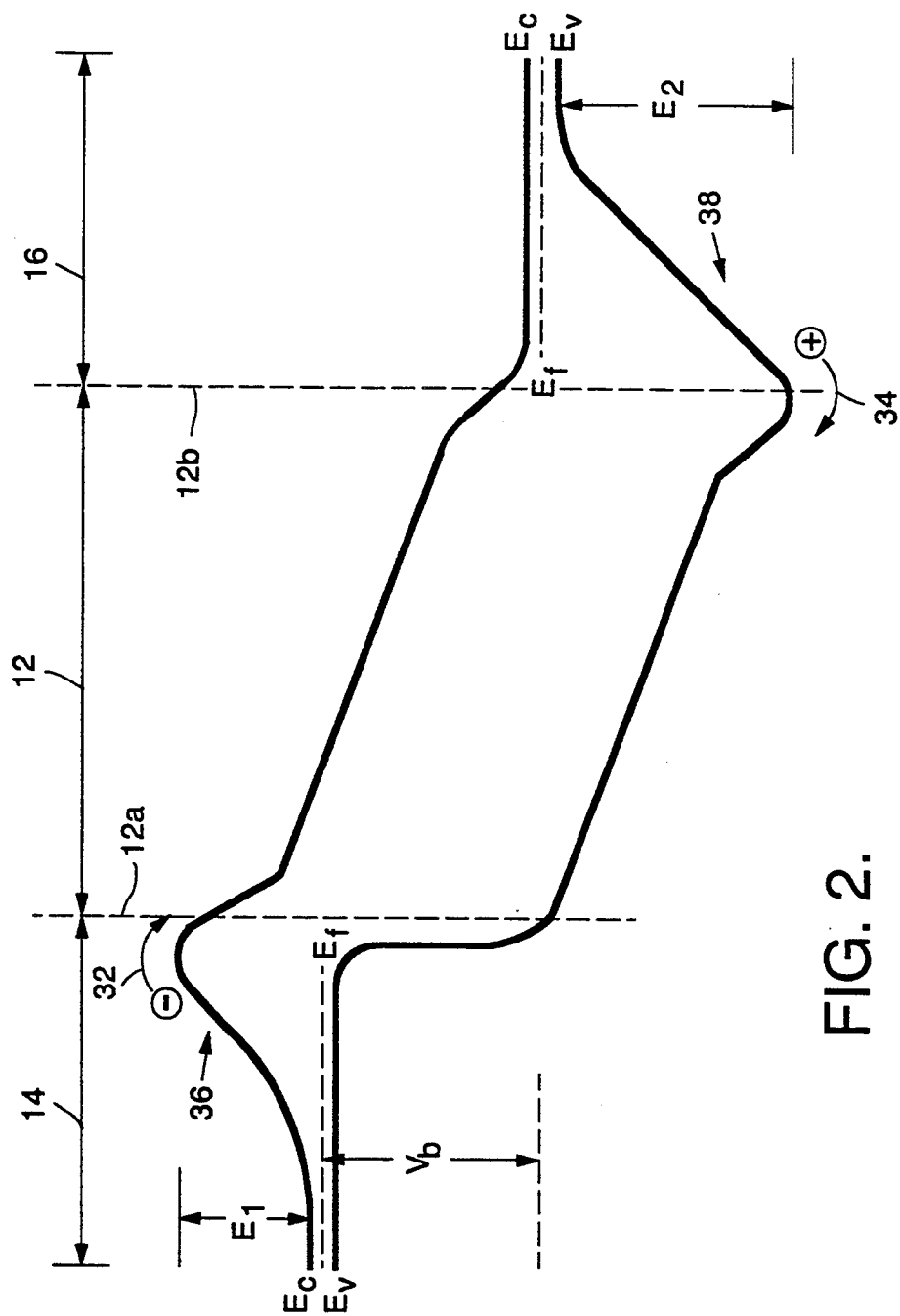
FIG. 2 is an energy band diagram of the present detector.

An energy diagram of the detector 10 is illustrated in FIG. 2, in which $E_c$ is the conduction band edge, $E_v$ is the valence band edge, $E_f$ is the Fermi level and $V_b$ is the bias voltage applied by the source 22. The bandgap $E_g$ at any point in the diagram is $E_g = E_c - E_v$.

In accordance with the invention, a potential barrier 36 having a maximum height of $E_1$ is created in the layer 14 and extends leftwardly from the surface 12a as illustrated. The barrier 36 extends upwardly (in the direction of increasing excitation energy for electrons), and opposes the flow of minority electrons from the layer 14 into the layer 12 as indicated by the arrow 32.

A potential barrier 38 having a maximum height of $E_2$ is created in the layer 16 and extends rightwardly from the surface 12b. The potential barrier 38 extends downwardly (in the direction of increasing excitation energy for holes), and opposes the flow of minority holes from the layer 16 into the layer 12 as indicated by the arrow 34.

In addition to the compositional grading, mercury and cadmium are interdiffused at the surfaces 12a and 12b. More specifically, the concentration of cadmium in the detector layer 12 is 1.0, whereas the concentration of cadmium in the doped layers 14 and 16 has a maximum preferred value of 0.8 at the surfaces 12a and 12b respectively. During an annealing operation during fabrication of the detector 10 as will be described in detail below, cadmium diffuses from the detector layer 12 into the adjacent regions of the doped layers 14 and 16.

In a similar manner, the concentration of mercury in the detector layer 12 is zero, whereas the concentration of mercury in the doped layers 14 and 16 has a minimum preferred value of 0.2 at the surfaces 12a and 12b respectively. During the annealing operation, mercury diffuses from the doped layers 14 and 16 into the adjacent regions of the detector layer 12. The effect of the interdiffusion is a further increase in the heights $E_1$ and $E_2$ of the potential barriers 36 and 38 respectively.

Although potential barriers corresponding to the present barriers 36 and 38 may exist if the compositions of the layers 14 and 16 were constant as in the prior art, the heights of the barriers would be considerably smaller. Carrier density is exponentially related to energy. Increasing the potential barrier height from the prior art maximum of 0.7 eV to a level of 1.0 eV which is attainable with the present invention reduces the leakage current by a factor of $10^5$ at 300° K.

Reduction of leakage currents reduces electrical noise and enables a larger voltage to be applied across the detector, thereby improving the charge collection efficiency and sharpening the energy resolution in the gamma ray energy spectrum. Another advantage of higher applied voltage is faster charge collection, thereby improving the time resolution of the detector.

The bandgap of the doped layers 14 and 16 is low at the interfaces with the ohmic contacts 18 and 20 respectively. This makes it easy to fabricate the detector 10 with low electrical resistance between the layers 14 and 16 and contacts 18 and 20. Whereas the potential barriers $E_1$ and $E_2$ provide high resistance to minority carrier leakage current, the low bandgap at the interfaces of the layers 14 and 16 and contacts 18 and 20 provides very low resistance to majority current flow created by detection of gamma rays.

Figure 3:
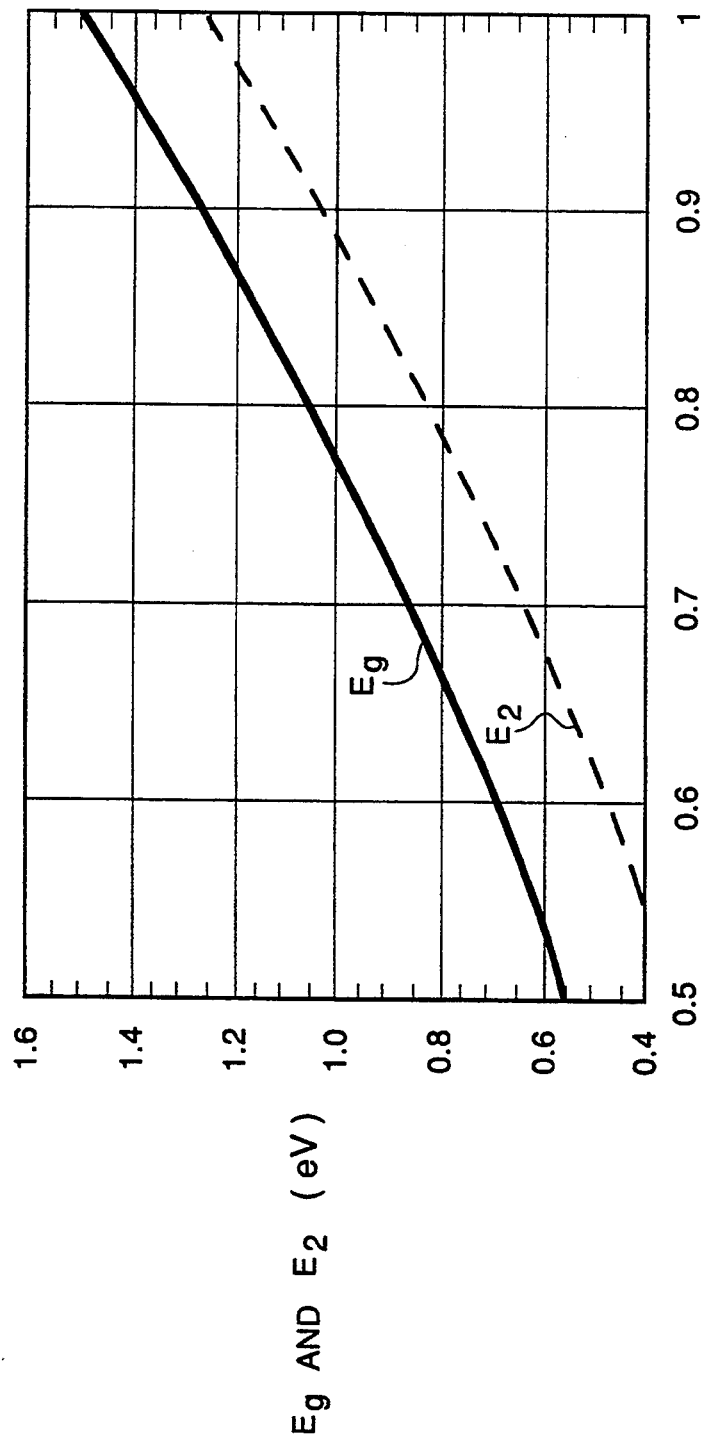
FIG. 3 is a graph illustrating the relationship between composition and potential barrier height in the present detector.

The P- and N- doping in the layers 14 and 16 clamps the valence and conduction band edges to levels slightly below and above the Fermi level in the layers 14 and 16 respectively as illustrated in FIG. 2. FIG. 3 illustrates the relationship between the value of x in the composition $Hg_{1-x}Cd_xTe$, and the bandgap $E_g$ and hole barrier height $E_2$ in the N-doped layer 16 at 300° K.

$E_g$ and $E_2$ are independent of the doping concentration. The height $E_2$ is measured at the surface 12b relative to the valence band edge $E_V$ for x=0.2, which occurs where the layer 16 interfaces to the ohmic contact 20. It will be seen from FIG. 3 that $E_g$ and $E_2$ increase with the value of x. The relationship is essentially similar for the P-doped layer 14.

A method of fabricating the detector 10 in accordance with the present invention includes providing the detector layer 12 in the form of a monocrystalline, intrinsic or near intrinsic wafer. The doped layers 14 and 16 are formed on the surfaces 12a and 12b of the detector layer 12, preferably using liquid phase epitaxy (LPE) with mercury melts containing the P and N dopants respectively. LPE enables the desired compositional grading to be produced in a well known manner.

The layers 12, 14 and 16 are then annealed in a mercury atmosphere at 400°–450° C. for approximately 0.5–4 hours, with the preferred annealing time being one hour. The annealing causes cadmium to diffuse from the detector layer 12 across the surfaces 12a and 12b into the adjacent regions of the doped layers 14 and 16, and causes mercury to diffuse from the doped layers 14 and 16 across the surfaces 12a and 12b into the adjacent regions of the detector layer 12 respectively without movement of the dopant ions in the layers 14 and 16.

This increases the heights $E_1$ and $E_2$ of the potential barriers 36 and 38 as described above.

Alternatively, some or all of the desired diffusion may occur during the LPE growth process that forms the contacting layers, which would typically be performed at temperatures of 400°–500° C.

EXAMPLE

A device fabricated as described with reference to FIGS. 1 and 2 was built and tested. The detector layer consists of $Cd_{0.96}Zn_{0.04}Te$. The P-type contact layer of $Hg_{1-x}Cd_xTe$ was grown with an arsenic (As) doping of approximately $5 \times 10^{17}$ cm$^{-3}$, and a thickness of 9 micrometers. The N-type contact layer of $Hg_{1-x}Cd_xTe$ was grown with an indium (In) doping of approximately $5 \times 10^{17}$ cm$^{-3}$, and a thickness of about 40 micrometers.

The composition of each contact layer was graded from x=0.8 at its interface with the CdZnTe detector layer to x=0.2 at its outer surface, where ohmic metal contacts were applied. The growths of the HgCdTe layers were performed by means of liquid phase epitaxy in mercury (Hg) melts.

The CdZnTe thickness was approximately 1,000 micrometers. The active area of the device was about 0.1 cm$^2$. Current-voltage tests of the device indicated that when the P-type contact was biased negatively with respect to the N-type contact (reverse bias), which is the preferred operating polarity, and the voltage was within the range of 0 to 80 volts, the leakage current through the device was minimal.

Specifically, in the absence of light and gamma rays, the effective resistivity of the device in this voltage range at room temperature was approximately $10^{11}$ ohm centimeters. This is higher than would be expected without blocking barriers in the contact layers. When a bias of the opposite polarity was applied (forward bias), the effective resistivity went down substantially, confirming the expected rectifying character of the P-I-N structure. These observations of the characteristics in reverse and forward bias are good evidence of the efficacy of the barriers.

Figure 4:
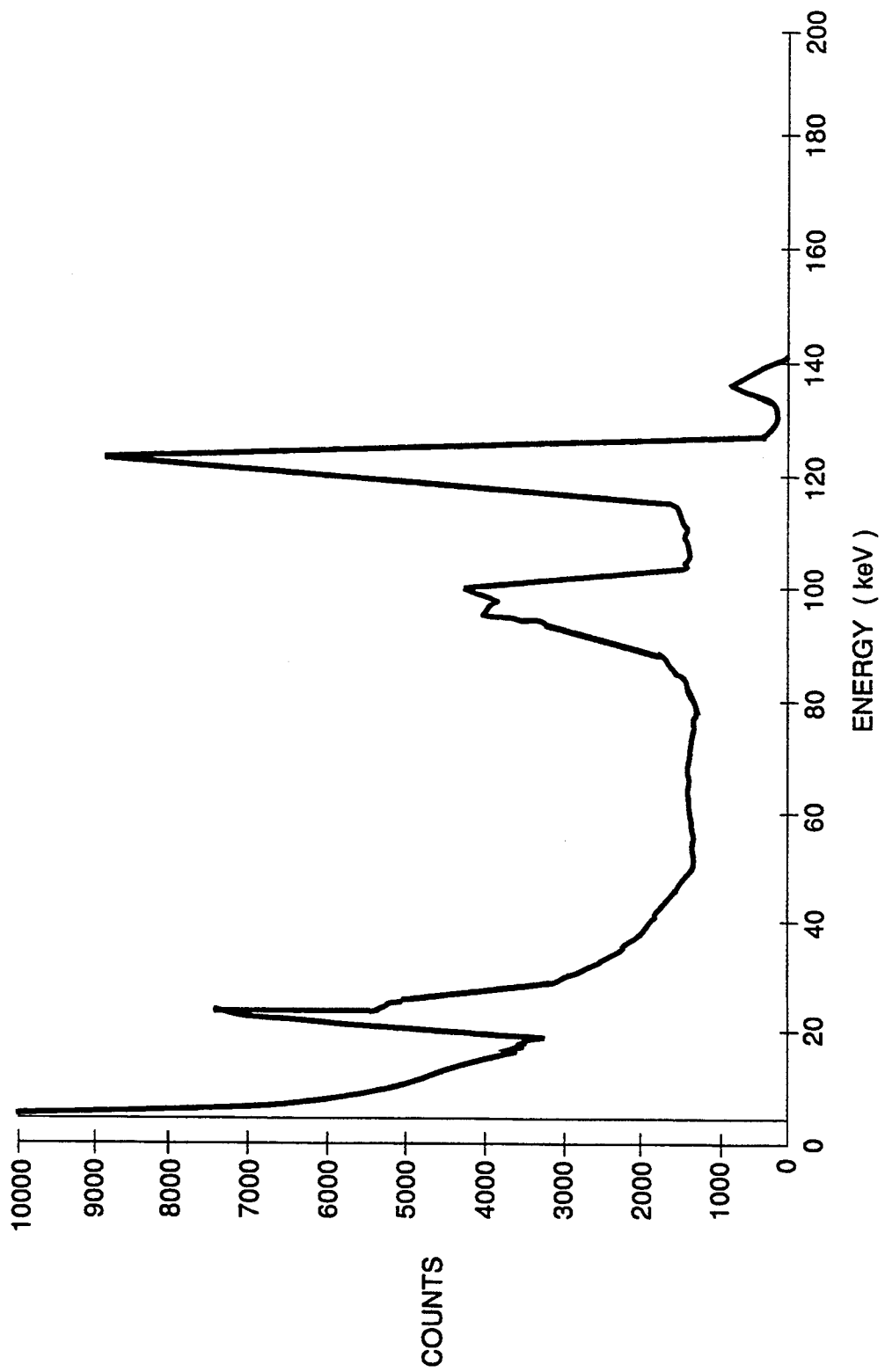
FIG. 4 is an actual pulse height spectrum illustrating the performance of a gamma ray detector built according to the invention.

A gamma-ray spectrum obtained at room temperature using the present detector is illustrated in FIG. 4. The applied bias voltage was 50 volts. The gamma ray source consisted of the isotope Co-57, and the gamma rays entered the detector layer by penetrating through the P-type contact layer. The strong sharp peak in FIG. 4 appearing at 122 keV represents the principle gamma ray of the isotope. The resolution is excellent, since the full width at half maximum (FWHM) of the peak is only 3.65 keV, which is 2.98% of the gamma ray energy.

The actual limitation in the FWHM in the test is believed to be electrical noise originating in the amplifier, rather than in the detector itself. The closely spaced peaks appearing between 90 and 100 keV are escape peaks caused by secondary x-ray effects that occur within the Cd and Te atoms of the detector.

While an illustrative embodiment of the invention has been shown and described, numerous variations and alternate embodiments will occur to those skilled in the art, without departing from the spirit and scope of the invention.

For example, although the present detector 10 has been described and illustrated as using cadmium telluride (or cadmium zinc telluride) for the detector layer 12 and mercury cadmium telluride for the doped layers 14 and 16, the invention is not limited to any particular combination of materials.

As a general rule, the materials for the detector layer and doped layers should be from the same material system such as II-VI or III-V, and the material for the doped layers should be ternary to enable compositional grading.

Cadmium and tellurium are elements from groups II and VI respectively of the periodic table, and constitute a group II-VI material system. Another possible II-VI material system for practicing the invention includes zinc sulfide (ZnS) for the detector layer and mercury zinc telluride (HgZnTe) for the doped layers.

Possible group III-V material systems include gallium arsenide (GaAs) for the detector layer and indium gallium arsenide (InGaAs) or indium gallium antimonide (InGaSb) for the doped layers. Another possible group III-V material system includes aluminum antimonide (AlSb) for the detector layer and aluminum indium antimonide (AlInSb) for the doped layers.

Accordingly, it is intended that the present invention not be limited solely to the specifically described illustrative embodiment. Various modifications are contemplated and can be made without departing from the spirit and scope of the invention as defined by the appended claims.

I claim:

1. A ray detector, comprising:
   a wide bandgap substantially intrinsic semiconductor detector layer;
   a P-doped semiconductor layer which is formed on a first surface of the detector layer and has a composition which is graded such that the bandgap of the P-doped layer decreases with distance from said first surface;
   a first ohmic contact formed on the P-doped layer;
   an N-doped semiconductor layer which is formed on a second surface of the detector layer and has a composition which is graded such that the bandgap of the N-doped layer decreases with distance from said second surface; and
   a second ohmic contact formed on the N-doped layer.

2. A detector as in claim 1, in which:
   the detector layer is formed of a material selected from the group consisting of cadmium telluride (CdTe) and cadmium zinc telluride (CdZnTe); and
   the P-doped layer and the N-doped layer are each formed of mercury cadmium telluride (HgCdTe).

3. A detector as in claim 2, in which:
   the concentration of cadmium (Cd) in the detector layer is higher than in the P-doped layer and in the N-doped layer; and
   the concentration of mercury (Hg) in the P-doped layer and in the N-doped layer is higher than in the detector layer.

4. A detector as in claim 3, in which:
   cadmium from the detector layer is diffused into the P-doped layer and into the N-doped layer across said first and second surfaces respectively; and
   mercury from the P-doped layer and from the N-doped layer is diffused into the detector layer across said first and second surfaces respectively.

5. A detector as in claim 2, in which:
   said composition of the P-doped layer is $Hg_{1-x}Cd_xTe$ and varies from approximately $0.6 \leq X \leq 1.0$ at said first suffice to approximately $0 \leq X \leq 0.4$ at the interface of the P-doped layer and the first ohmic contact; and
   said composition of the N-doped layer is $Hg_{1-x}Cd_xTe$ and varies from approximately $0.6 \leq X \leq 1.0$ at said first surface to approximately $0 \leq X \leq 0.4$ at the interface of the N-doped layer and the second ohmic contact.

6. A detector as in claim 5, in which the doping concentration in the P-doped layer and in the N-doped layer is approximately $10^{16}$–$10^{18}$ ions/cm$^3$.

7. A detector as in claim 6, in which the P-doped layer and the N-doped layer are each approximately 2–50 micrometers thick.

8. A detector as in claim 2, in which:
   said composition of the P-doped layer is $Hg_{1-x}Cd_xTe$ and varies from approximately x=0.8 at said first surface to approximately x=0.2 at the interface of the P-doped layer and the first ohmic contact; and
   said composition of the N-doped layer is $Hg_{1-x}Cd_xTe$ and varies from approximately x=0.8 at said second surface to approximately x=0.2 at the interface of the N-doped layer and the second ohmic contact.

9. A detector as in claim 8, in which the doping concentration in the P-doped layer and in the N-doped is approximately $10^{18}$ ions/cm$^3$.

10. A detector as in claim 9, in which the P-doped layer and the N-doped layer are each approximately 20 micrometers thick.

11. A detector as in claim 10, in which the detector layer is approximately 1,000 micrometers thick.

12. A detector as in claim 1, in which:
    the detector layer is formed of a compound material selected from groups II and VI of the periodic table; and
    the P-doped layer and the N-doped layer are formed of a ternary compound material selected from groups II and VI of the periodic table.

13. A detector as in claim 1, in which:
    the detector layer is formed of a compound material selected from groups III and V of the periodic table; and
    the P-doped layer and the N-doped layer are formed of a ternary compound material selected from groups III and V of the periodic table.

14. A method of fabricating a ray detector, comprising the steps of:
    (a) providing a wide bandgap substantially intrinsic semiconductor detector layer;
    (b) forming a P-doped semiconductor layer on a first surface of the detector layer having a composition which is goaded such that the bandgap of the P-doped layer decreases with distance from said first surface;
    (c) forming a first ohmic contact on the P-doped layer;
    (d) forming an N-doped semiconductor layer on a second surface of the detector layer having a composition which is graded such that the bandgap of the N-doped layer decreases with distance from said second surface; and
    (e) forming a second ohmic contact on the N-doped layer.

15. A method as in claim 14, in which:
    step (a) comprises providing the detector layer of a material selected from the group consisting of cadmium telluride (CdTe) and cadmium zinc telluride (CdZnTe);

step (b) comprises forming the P-doped layer of mercury cadmium telluride (HgCdTe); and step (d) comprises forming the N-doped layer of mercury cadmium telluride.

16. A method as in claim 15, in which steps (b) and (d) in combination comprise annealing the detector layer, P-doped layer and N-doped layer at a first temperature and a time duration sufficient to diffuse cadmium from the detector layer into the P-doped layer and into the N-doped layer across said first and second surfaces respectively, and to diffuse mercury from the P-doped layer and from the N-doped layer into the detector layer across said first and second surfaces respectively but less than a second temperature sufficient to cause significant movement of dopant ions in said P-doped and N-doped semiconductor layers.

17. A method as in claim 16, in which steps (b) and (d) in combination comprise annealing the detector layer, P-doped layer and N-doped layer in a mercury vapor at a temperature of approximately 400°–450° C. for approximately 0.5–4 hours.

18. A method as in claim 16, in which steps (b) and (d) in combination comprise annealing the detector layer, P-doped layer and N-doped layer in a mercury vapor at a temperature of approximately 400°–450° C. for approximately one hour.

19. A method as in claim 15, in which:

step (b) comprises liquid phase epitaxy (LPE) using a mercury melt including a P-type dopant; and step (d) comprises liquid phase epitaxy (LPE) using a mercury melt including an N-type dopant.

20. A method as in claim 14 further including the step of:

(f) annealing said detector layer, said P-doped layer and said N-doped layer at a first temperature and a time duration sufficient to diffuse semiconductor atoms in both directions across said first and second surfaces but less than a second temperature sufficient to cause significant movement of dopant ions in said P-doped and N-doped semiconductor layers.

21. A method as in claim 14, in which:

step (a) comprises providing the detector layer of a compound material selected from groups II and VI of the periodic table;

step (b) comprises forming the P-doped layer of a compound ternary material selected from groups II and VI of the periodic table; and step (d) comprises forming the N-doped layer of a compound ternary material selected from groups II and VI of the periodic table.

22. A method as in claim 14, in which:

step (a) comprises providing the detector layer of a compound material selected from groups III and V of the periodic table;

step (b) comprises forming the P-doped layer of a compound ternary material selected from groups III and V of the periodic table; and step (d) comprises forming the N-doped layer of a compound ternary material selected from groups III and V of the periodic table.

* * * * *